United States Patent
Dorgeuille et al.

(10) Patent No.: US 6,867,911 B2
(45) Date of Patent: Mar. 15, 2005

(54) OPTICAL AMPLIFIER DEVICE

(75) Inventors: François Dorgeuille, Paris (FR); Stéphane Rabaron, Fontenay aux Roses (FR); Frédéric Pommereail, Lardy (FR); Claude Artigue, Bourg la Reine (FR); Philippe Brosson, Forges les Bains (FR)

(73) Assignee: Avanex Corporation, Fremont, CA (US)

( * ) Notice: Subject to any disclaimer, the term of this patent is extended or adjusted under 35 U.S.C. 154(b) by 113 days.

(21) Appl. No.: 10/111,053

(22) PCT Filed: Aug. 20, 2001

(86) PCT No.: PCT/FR01/02630
§ 371 (c)(1),
(2), (4) Date: Apr. 19, 2002

(87) PCT Pub. No.: WO02/17452
PCT Pub. Date: Feb. 28, 2002

(65) Prior Publication Data
US 2002/0154392 A1 Oct. 24, 2002

(30) Foreign Application Priority Data
Aug. 22, 2000 (FR) .......................................... 00 10819

(51) Int. Cl.[7] .............................................. H01S 3/00
(52) U.S. Cl. ...................................................... 359/344
(58) Field of Search ........................ 359/344; 372/43–50

(56) References Cited

U.S. PATENT DOCUMENTS

| | | | |
|---|---|---|---|
| 5,388,117 A | * 2/1995 | Nishimura | 372/45 |
| 5,394,423 A | 2/1995 | Kasahara | 372/45 |
| 5,488,507 A | * 1/1996 | Nishimura | 359/344 |
| 5,526,176 A | * 6/1996 | Furukawa | 359/344 |
| 5,550,393 A | * 8/1996 | Nishimura | 257/192 |
| 5,574,289 A | * 11/1996 | Aoki et al. | 257/17 |

(List continued on next page.)

FOREIGN PATENT DOCUMENTS

| | | | | |
|---|---|---|---|---|
| EP | 000615323 A2 | * | 9/1994 | |
| EP | 0935321 A1 | | 8/1999 | ............. H01S/3/18 |
| JP | 2000349399 A | * | 12/2000 | |
| JP | 2001053392 A | * | 2/2001 | |
| JP | 2001117128 A | * | 5/2001 | |
| JP | 2002171027 A | * | 6/2002 | |

OTHER PUBLICATIONS

Patent Abstracts of Japan, vol. 1998, No. 13, Nov. 30, 1998 corresponding to JP10215022 A (Kaguku Gijutsu Shinko Jigyodan; Suga Hirobumi) dated Aug. 11, 1998.

Patent Abstracts of Japan, vol. 1999, No. 04, Apr. 30, 1999 corresponding to JP 11017260A (NEC Corp) dated Jan. 22, 1999.

R. Varma et al, "Bonding Induced Stress in Semiconductor laser", Orlando, Jun. 1–4, 1993, NY, IEEE, US, vol. Conf. 43, Jun. 1, 1993, pp. 482–484 XP000380045.

Patent Abstracts of Japan, vol. 017, No. 434 (E–1412), Aug. 11, 1993 corresponding to JP 05 090703A (Nippon Telegr & Telph Cor) dated Apr. 9, 1993.

*Primary Examiner*—Thomas H. Tarcza
*Assistant Examiner*—Deandra M. Hughes
(74) *Attorney, Agent, or Firm*—Moser, Patterson & Sheridan, L.L.P.

(57) ABSTRACT

The invention relates to an optical amplifier device including a semiconductor optical amplifier component (1) including a guide active structure (12), characterized in that the guide active structure (12) is subjected to a stress external to said component (1) coming from integrating said component (1) in said device, and in that said component (1) has a controlled sensitivity to the state of polarization of the light to be amplified in order to render the gain of said optical amplifier device insensitive to the polarization of said light to be amplified.

15 Claims, 1 Drawing Sheet

U.S. PATENT DOCUMENTS

Figure 1:
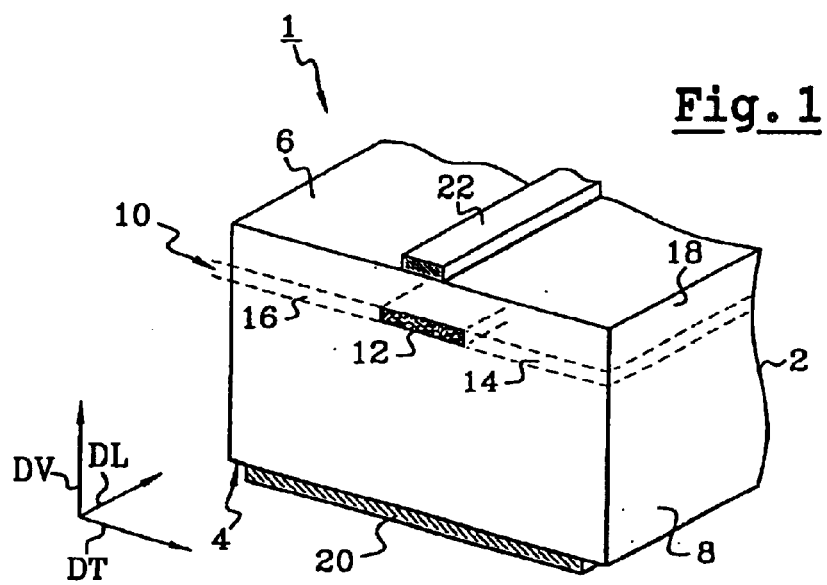

| | | | | |
|---|---|---|---|---|
| 5,757,023 A | * | 5/1998 | Koteles et al. | 257/18 |
| 5,790,302 A | * | 8/1998 | Tiemeijer | 359/344 |
| 5,953,362 A | | 9/1999 | Pamulapati et al. | 372/96 |
| 5,982,531 A | | 11/1999 | Emery et al. | 359/344 |
| 6,148,132 A | * | 11/2000 | Hamamoto | 385/131 |
| 6,175,446 B1 | * | 1/2001 | Alphonse | 359/344 |
| 6,288,410 B1 | * | 9/2001 | Miyazawa | 257/14 |
| 6,310,719 B1 | * | 10/2001 | Goldstein et al. | 359/344 |
| 6,310,720 B1 | * | 10/2001 | Walker et al. | 359/344 |
| 6,487,007 B1 | * | 11/2002 | Morito | 359/344 |
| 6,545,801 B2 | * | 4/2003 | Morito | 359/344 |
| 2001/0043390 A1 | * | 11/2001 | Kim et al. | 359/344 |
| 2002/0149073 A1 | * | 10/2002 | Goldstein et al. | 257/418 |

* cited by examiner

OPTICAL AMPLIFIER DEVICE

The present invention relates to amplifying optical signals. It finds a typical application in fiber optic telecommunication networks. The signals transmitted by fiber optic telecommunication networks consist of pulses carrying information to be transmitted in binary form. The pulses must be amplified to compensate power losses they suffer during their propagation in the networks.

Semiconductor optical amplifier devices constitute one solution to providing this amplification. Semiconductor optical amplifier devices are also at the heart of many vital opto-electronic functions in very high bit rate optical telecommunication networks. Nonlimiting examples include wavelength converters and high-speed optical gates. In all such applications, the optical amplifier device is used "in line" with an optical fiber. Because the optical fiber does not maintain the polarization of the injected light, the characteristics of the semiconductor optical amplifier must not depend on the state of polarization of the light to be amplified.

However, in the absence of special measures, all characteristics of an optical amplifier, in particular its gain, are sensitive to the state of polarization of the light that it receives, which will be referred to more simply hereinafter by referring to the polarization-sensitivity of an amplifier.

The sensitivity of the gain to the polarization of the light can be quantified by the following parameter: $\Delta G_{TE/TM}(dB)=G_{TE}(dB)-G_{TM}(dB)$, where G(dB) represents the gain of the amplifier expressed in decibels and the subscripts TE and TM correspond to the two modes in which light can propagate in the amplifier. If $\Delta G_{TE/TM}(dB)$ is positive, the term "TE sensitivity" is used, and if it is negative the term "TM sensitivity" is used.

As a general rule, to be used in a fiber optic communication system, an opto-electronic device must have optical and electrical input and/or output interfaces. The term "opto-electronic module" is then used.

In the context of the invention, the simplest module contains a chip which constitutes the semiconductor optical amplifier (SOA). The chip is mounted on a base, for example of silicon, and connected by electrodes. The module also includes light coupling means between the SOA chip and the input and output optical fibers.

Theory indicates that some techniques for mounting an SOA chip on a base can generate a stress field on the active layer of the chip which modifies the parameter $\Delta G$, in other words $\Delta G_{(device)} \neq \Delta G_{(SOA)}$. This has been confirmed by experiment. The stresses can arise, for example, from a return force exerted when fixing the SOA chip to the base, or from a force exerted by a connection land, or from any force exerted on the SOA chip as a result of integrating it into an optical amplifier device.

The present invention can therefore be applied in particular to the situation in which it is necessary to eliminate or at least to limit the sensitivity of the optical amplifier device to the polarization of the light. The target is to achieve $|\Delta G_{(device)}|<1$ dB.

More generally, the present invention finds an application whenever the sensitivity of an optical amplifier device to polarization must be zero or small.

The invention applies to devices including an SOA chip, regardless of its structure. In the embodiment described hereinafter, the SOA chip is of the "buried ribbon" type. The active structure used to produce the chip (i.e. which injects charge carriers into the active ribbon) is known as a buried ridge structure (BRS).

This kind of prior art semiconductor optical amplifier component 1 (shown in FIG. 1) includes a wafer 2 consisting of layers of semiconductor materials having respective refractive indices and forming a common crystal lattice. In the absence of mechanical stresses, the respective lattices of these materials have characteristic dimensions constituting respective lattice parameters of the materials. These layers form a succession in a vertical direction DV forming a trirectangular trihedron with two horizontal directions constituting a longitudinal direction DL and a transverse direction DT, these directions being defined with respect to the wafer 2. These layers form an upward succession in the vertical direction DV from a bottom face 4 to a top face 6. The wafer 2 includes at least the following layers or groups of layers or parts of layers:

A substrate 8 consisting mainly of a semiconductor basic material having a first conductivity type. The substrate is thick enough to impose the dimensions of the lattice of the basic material on the whole of the crystal lattice of the wafer 2.

An active layer 10 including an active material able to amplify light by stimulated recombination of charge carriers of both types injected into the material.

A guide structure 12 including at least one buried ribbon having a refractive index higher than that of the surrounding materials. The ribbon 12 extends in the longitudinal direction DL to guide light in that direction. The ribbon 12 has a transverse width l and a vertical thickness e.

Finally, a top confinement layer 18 consisting of a material having a second conductivity type which is the opposite of the first type.

The amplifier further includes a bottom electrode 20 and a top electrode 22 respectively formed on the bottom face 4 and the top face 6 of the wafer 2 to enable an electric current to pass between these faces for injecting charge carriers of the two types into the active material.

The basic materials of prior art semiconductor optical amplifiers are III–V materials, typically indium phosphide and gallium arsenide. The active material is typically a ternary or quaternary material containing the same chemical elements. The width l of the ribbon 12 that guides the light is generally required to be greater than one micrometer, to facilitate etching the ribbon and, most importantly, to facilitate integrating the amplifier with other optical components on the same semiconductor wafer. The thickness e must then be very much less than the width l to ensure monomode guiding of the light, the wavelength of which is typically 1 310 nm or 1 550 nm. If no particular measures are implemented, it is this rectangular shape of the section of the ribbon 12 that leads to the previously mentioned polarization sensitivity of the SOA chip.

In buried ridge structure (BRS) amplifiers, the active material 10 constituting the ribbon 12 guiding the light to be amplified is surrounded on all sides by a binary semiconductor material 14, 16 whose refractive index is slightly lower than that of the active material. In the embodiment described, the active material 10 is homogeneous, in which case it is referred to as a bulk material. This example is not limiting on the invention, which applies equally if the material of the active layer 10 consists of multiple quantum wells.

Given the small difference in index between the ribbon 12 and the surrounding binary material 14, 16, and the strongly rectangular section of the buried ribbon 12, the confinement factor of a wave with horizontal polarization is greater than that of a wave with vertical polarization, the difference between the two confinement factors increasing as the ratio of the width l to the thickness e of the ribbon increases. The confinement is defined for each polarization and for each wavelength by the shape and the dimensions of the section of the ribbon and by the refractive indices of the material of the ribbon and the surrounding material. A confinement factor ratio is therefore defined as $\Gamma_{TE}/\Gamma_{TM}$.

The sensitivity of the gain of an SOA chip to the state of polarization of the incident light is given by the following equation, derived in the publication "New, process tolerant, high performance 1.55 μm polarization insensitive semiconductor optical amplifier based on low tensile bulk GaInAsP" by J. Y. Emery, P. Doussière, L. Goldstein, F. Pommereau, C. Fortin, R. N'Go, N. Tscherpner, J. L. Lafragette, P. Aubert, F. Brillouet, G. Laube and J. Barrau in European Conf. Opt. Commun. (ECOC), Oslo, Norway, paper WeD.2.3, 1996.

$$\Delta G_{(SOA)}(dB) = G_{TE}(dB) * (1 - g_{TM}/g_{TE} * \Gamma_{TE}/\Gamma_{TM}) \qquad [1]$$

where $G_{TE}(dB)$ is the gain of the semiconductor optical amplifier for the TE light propagation mode, $g_{TM}/g_{TE}$ is the ratio of the gains of the active material, and $\Gamma_{TE}/\Gamma_{TM}$ is the ratio of the confinement factors.

With this embodiment it is found that the polarization sensitivity depends on the geometry of the ribbon 12 (confinement factor ratio), as well as the stresses exerted on the material of the active layer (gain ratio).

Accordingly, and regardless of the nature and the origin of the stress, a stress field exerted on the guide active structure 12 of an SOA chip 1 will modify the isotropy of the response of the active material, i.e. $g_{TM}/g_{TE} \neq 1$.

To make an optical amplifier device, the optical amplifier component or SOA chip previously described is mounted on a base in order to integrate it into a module with other optical components, such as an optical fiber, a detector, etc.

There are several techniques for mounting an SOA chip on a base. One prior art technique for fabricating "low cost" components is known as "flip chip" mounting of the SOA chip, which entails overturning the chip and positioning it on the base by a process known as auto-alignment. This technique is shown diagrammatically in FIG. 2.

The autoalignment technique consists in producing complementary indentations 32, 34 on the SOA chip 1 and on the base 30 and bringing them into abutment by a return force F exerted on the chip 1 when it is flip chip mounted on the base 30. The return force F is obtained when welding the chip 1 to the base 30 by a method that consists in fusing respective metal studs 25, 26 deposited on the chip 1 and on the base 30. Gold and gold/tin studs are generally used in this method. Because of the complementary indentations 32 and 34, the SOA chip is auto-aligned in front of a fiber placed in a groove which is itself aligned with respect to the indentation 32. The expression "passive auto-alignment of the SOA chip in front of the fiber" is therefore used, as discussed in the publication "Low cost laser modules for STM" by W. Rehm, K. Adam, A. Göth, W. Jörg, J. Lauckner, J. Scherb, P. Aribaud, C. Artigue, C. Duchemin, B. Fernier, E. Grard, D. Keller, S. Kerboeuf, S. Rabaron, J. M. Rainsaint, D. Tregoat, J. L. Nicque, A. Tournereau, P. J. Laroulandie, P. Berthier in ETCT'2000, Las Vegas, USA, 2000.

It has been found that the return force F induces a stress field on the guide active structure 12 of the SOA chip 1, which modifies its sensitivity to the polarization of the light to be amplified. The sensitivity is reproducible for a fixed assembly procedure. For example, using the passive auto-alignment technique previously described, and SOA chips whose active structure corresponds to equation [1] and has an internal gain $G_{TE}(dB)$ of the order of 28 dB, the amplitude of the displacement $\Delta G_{(device)} - \Delta G_{(SOA)}$ of the sensitivity of the SOA chip is of the order of +2 dB.

The object of the present invention is to remove the drawbacks of the prior art.

To this end, the invention proposes to compensate unwanted effects of integrating an SOA chip into a low cost optical amplifier device by applying a supplementary internal or external stress directly to the guide active structure of the SOA chip, so that the global stress to which said guide active structure is subjected renders the gain of the amplifier device insensitive to the polarization of the light.

The SOA chip is therefore intentionally rendered sensitive to the polarization of the light to be amplified, so that the optical device into which it is integrated is insensitive to the polarization of said light.

The invention relates more particularly to an optical amplifier device integrating a semiconductor optical amplifier component including a guide active structure, characterized in that the guide active structure is subjected to a stress external to said component coming from integrating said component in said device, and in that said component has a controlled sensitivity to the state of polarization of the light to be amplified in order to render the gain of said optical amplifier device insensitive to the state of polarization of said light to be amplified.

According to one feature, the stress external to the component comes from mounting said component on a base by a passive auto-alignment method.

According to another feature, the stress external to the component comes from connecting said component by an electrode situated above the guide active structure and approximately the same width as said guide active structure.

In one embodiment, the sensitivity of the gain of the component to the state of polarization of the light to be amplified is controlled by adjusting the lattice mismatch of the semiconductor material constituting the guide active structure.

In another embodiment, the sensitivity of the gain of the component to the state of polarization of the light to be amplified is controlled by adjusting the confinement factor of the guide active structure.

In another embodiment, the sensitivity of the gain of the component to the state of polarization of the light to be amplified is controlled by adjusting a force induced by depositing oxide against a ribbon surrounding the guide active structure.

In another embodiment, the sensitivity of the gain of the optical component to the state of polarization of the light to be amplified is controlled by actively adjusting two sections of the guide active structure respectively favoring a higher gain of the TE mode and of the TM mode of polarization of the light to be amplified.

Figure 2:
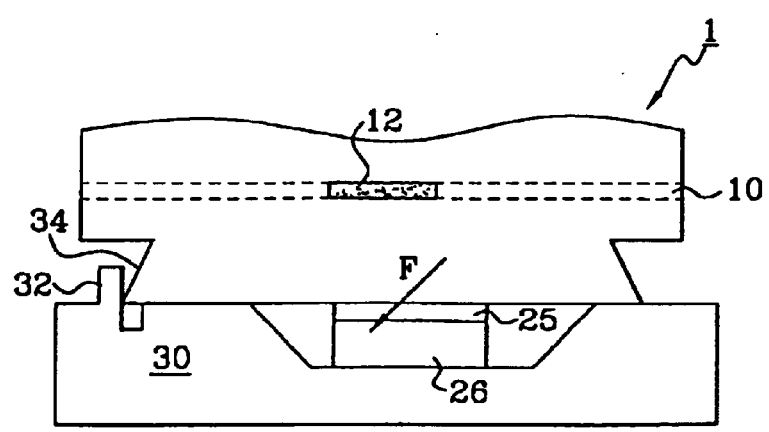

The features and advantages of the present invention will become apparent in the course of the following description, which is given by way of nonlimiting and illustrative example, and with reference to the drawings, in which:

FIG. 1, already described, is a diagram showing a prior art buried ribbon SOA chip, FIG. 2 is a diagram showing the passive auto-alignment technique.

The following description concerns an optical amplifier device in an optical module and including a component 1 (an SOA chip) mounted on a base 30 and connected by an electrode 22.

The objective of the invention is to provide a device insensitive to the polarization of the light to be amplified with $|\Delta G_{(device)}| < 1$ dB.

It has previously been established that the polarization sensitivity of the device is affected by stress fields on the guide active structure 12 of the SOA chip 1, which stress fields can come from the chip itself (geometrical or material stresses internal to the active layer 10 or to the guide active structure 12) or from assembling the chip into the device (external mounting or connection stresses). These stress fields modify the ratio of the material gains of the guide active structure 12, i.e. $g_{TM}/g_{TE}\neq 1$.

The present invention is therefore characterized by the fact that an SOA chip is intentionally rendered sensitive to the mode of polarization of light to be amplified (i.e. $\Delta G_{(SOA)}\neq 0$) in order to compensate the sensitivity induced by assembling the chip into an optical module.

The guide active structure 12 of the SOA chip 1 is therefore subjected, on the one hand, to an external stress resulting from integrating the chip 1 into a device and, on the other hand, to a supplementary stress internal to the chip 1, the combination of these two stresses rendering the gain of said optical amplifier device insensitive to the polarization of the light to be amplified.

Depending on the applications and uses of the invention, the external stress of integrating the chip into a module can come from mounting the SOA chip 1 on a base 30 by a passive auto-alignment method and/or connecting the chip 1 by an electrode 22 situated above the guide active structure 22, the electrode being approximately the same width as the guide active structure.

The return force employed in the passive auto-alignment method induces a stress field on the guide active structure 12 of the chip.

Similarly, connecting the chip 1 by an electrode 22 having approximately the same dimensions as the guide active structure 12 can induce a force on the active structure 12 that modifies the isotropy of the response of the active material 10 to the polarization of the light to be amplified.

To this end, the component 1 is designed so that its gain has a controlled sensitivity to the polarization of the light to be amplified. The guide active structure 12 of the chip is therefore subjected to stresses other than those engendered by integrating the component into the device and applied directly to the SOA chip.

In a first embodiment, the sensitivity of the gain of the SOA chip 1 can be controlled by adjusting the lattice mismatch of the semiconductor material constituting the guide active structure 12.

The applicant's U.S. Pat. No. 5,982,531 proposes an SOA chip rendered insensitive to the polarization of the light despite the strongly rectangular geometry of its buried ribbon. The amplifier is characterized in that its active material is subjected to a sufficient tension stress to render its gain insensitive to the polarization of said light to be amplified. This stress generally results from a lattice mismatch between the active material and the basic material.

A technique of the above kind can be transformed in the context of the present invention to render the gain of the guide active structure 12 of the SOA chip 1 intentionally sensitive to the polarization of the light to be amplified.

The law governing the parameter $\Delta a/a$ that represents the lattice mismatch in the active layer is known in the art and developed in the publication previously cited with reference to equation [1]. It is therefore possible to produce an SOA chip by the technique developed in U.S. Pat. No. 5,982,531 which has a given TE or TM polarization sensitivity to compensate the sensitivity induced by assembling and/or connecting the SOA chip into its optical device (and known because it is determined by the method chosen).

In a different embodiment, the sensitivity of the gain of the SOA chip 1 can be controlled by adjusting the confinement factors $\Gamma_{TE}/\Gamma_{TM}$ of the guide active structure 12. It has already been explained that the geometry of the ribbon has a direct impact on its sensitivity to the polarization of the light.

It is equally possible to control the sensitivity of the gain of the SOA chip 1 by depositing oxide on a ribbon surrounding the active structure 12 of the chip 1; this induces a tension or compression force, depending on the nature of the oxide, which modifies the sensitivity of the gain of the SOA chip 1 toward the TE mode or toward the TM mode.

Consideration can also be given to controlling the sensitivity of the gain of the SOA chip 1 by active adjustment of two amplifier sections of the active structure 12, each favoring a respective higher gain of the TE mode and the TM mode of polarization of the light to be amplified.

The embodiments described can be combined to obtain an SOA chip 1 in which the sensitivity of the gain to the state of polarization of the light to be amplified is perfectly controlled so as to obtain, after mounting the chip in an optical module, an amplifier device whose gain is insensitive to the state of polarization of the light to be amplified.

What is claimed is:

1. An optical amplifier device integrating a semiconductor optical amplifier component including a guide active structure, characterized in that the guide active structure is subjected to a stress external to said component coming from mounting said component on a base by a passive auto-alignment method, and in that said component has a controlled sensitivity to the state of polarization of a light to be amplified in order to render the gain of said optical amplifier device insensitive to the state of polarization of said light to be amplified.

2. The optical amplifier device according to claim 1, characterized in that the sensitivity of the gain of the component to the state of polarization of the light to be amplified is controlled by adjusting the lattice mismatch of the semiconductor material constituting the guide active structure.

3. The optical amplifier device according to claim 1, characterized in that the sensitivity of the gain of the component to the state of polarization of the light to be amplified is controlled by adjusting the confinement factor of the guide active structure.

4. The optical amplifier device according to claim 1, characterized in that the sensitivity of the gain of the component to the state of polarization of the light to be amplified is controlled by adjusting a force induced by depositing oxide against a ribbon surrounding the guide active structure.

5. The optical amplifier device according to claim 1, characterized in that the sensitivity of the gain of the optical component to the state of polarization of the light to be amplified is controlled by actively adjusting two sections of the guide active structure respectively favoring a higher gain of the TE mode and of the TM mode of polarization of the light to be amplified.

6. A method of limiting the sensitivity of an optical amplifier device having a semiconductor optical amplifier component (SOA) to the polarization of light to be amplified comprising:

applying an external stress to the SOA by mounting the SOA on a base by a passive auto-alignment method, the SOA having a guide active structure; and compensating for a polarization sensitivity to render a gain of the optical amplifier device insensitive to the state of polarization of light to be amplified, wherein such compensation causes an internal stress to the SOA.

7. The method of claim 6, wherein compensating for the polarization sensitivity includes adjusting a lattice mismatch of a semiconductor material comprising the guide active structure.

8. The method of claim 6, wherein compensating for the polarization sensitivity includes adjusting a confinement factor of the guide active structure.

9. The method of claim 6, wherein compensating for the polarization sensitivity includes adjusting a force induced by depositing oxide against a ribbon surrounding the guide active structure.

10. The method of claim 6, wherein compensating for the polarization sensitivity includes actively adjusting two sections of the guide active structure respectively favoring a higher gain of a TE mode and of a TM mode of polarization of the light to be amplified.

11. An optical amplifier device integrating a semiconductor optical amplifier component including a guide active structure, characterized in that the guide active structure is subjected to a stress external to said component coming from connecting said component by an electrode situated above the guide active structure and approximately the same width as said guide active structure, and in that said component has a controlled sensitivity to the state of polarization of a light to be amplified in order to render the gain of said optical amplifier device insensitive to the state of polarization of said light to be amplified.

12. The optical amplifier device according to claim 1, characterized in that the sensitivity of the gain of the component to the state of polarization of the light to be amplified is controlled by adjusting the lattice mismatch of the semiconductor material constituting the guide active structure.

13. The optical amplifier device according to claim 1, characterized in that the sensitivity of the gain of the component to the state of polarization of the light to be amplified is controlled by adjusting the confinement factor of the guide active structure.

14. The optical amplifier device according to claim 1, characterized in that the sensitivity of the gain of the component to the state of polarization of the light to be amplified is controlled by adjusting a force induced by depositing oxide against a ribbon surrounding the guide active structure.

15. The optical amplifier device according to claim 1, characterized in that the sensitivity of the gain of the optical component to the state of polarization of the light to be amplified is controlled by actively adjusting two sections of the guide active structure respectively favoring a higher gain of the TE mode and of the TM mode of polarization of the light to be amplified.

* * * * *